(12) United States Patent
Khlat (10) Patent No.: US 9,991,851 B1
(45) Date of Patent: Jun. 5, 2018

(54) MULTI-MODE RADIO FREQUENCY (RF) POWER AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days. days.

(21) Appl. No.: 15/596,836

(22) Filed: May 16, 2017

Related U.S. Application Data (60) Provisional application No. 62/422,328, filed on Nov. 15, 2016.

(51) Int. Cl.
*H03F 1/02* (2006.01)
*H03F 3/195* (2006.01)
*H03F 3/213* (2006.01)

(52) U.S. Cl.
CPC ........... *H03F 1/0233* (2013.01); *H03F 3/195* (2013.01); *H03F 3/213* (2013.01); *H03F 2200/102* (2013.01); *H03F 2200/411* (2013.01); *H03F 2200/451* (2013.01)

(58) Field of Classification Search
CPC ................................. H03F 1/0211; H03F 1/30
USPC .................................................. 330/127, 297
See application file for complete search history.

(56) References Cited

U.S. PATENT DOCUMENTS

| | | | | |
|---|---|---|---|---|
| 9,270,230 | B2* | 2/2016 | Henshaw | H03F 1/0227 |
| 2012/0068767 | A1* | 3/2012 | Henshaw | H03F 1/0227 330/127 |
| 2014/0203878 | A1* | 7/2014 | Reisner | H03F 1/0222 330/297 |
| 2015/0009980 | A1* | 1/2015 | Modi | H03F 3/245 370/338 |
| 2016/0181995 | A1* | 6/2016 | Nentwig | H03F 3/211 330/295 |
| 2017/0093340 | A1* | 3/2017 | Khesbak | H03F 1/0222 |

* cited by examiner

*Primary Examiner* — Henry Choe
(74) *Attorney, Agent, or Firm* — Withrow & Terranova, P.L.L.C.

(57) ABSTRACT

A multi-mode radio frequency (RF) power amplifier circuit is disclosed. The multi-mode RF power amplifier circuit can operate in a low-resource block (RB) mode and a high-RB mode. The multi-mode RF power amplifier circuit includes a driver stage power amplifier and an output stage power amplifier to amplify an RF input signal and generate an RF output signal. A control circuit is configured to provide a constant envelope voltage and an envelope tracking (ET) supply voltage to the driver stage power amplifier and the output stage power amplifier, respectively, in the high-RB mode. As a result, it is possible to optimize RF performance and reduce sensitivity of the driver stage power amplifier and the output stage power amplifier in the high-RB mode, without increasing costs and footprint of the multi-mode RF power amplifier circuit.

20 Claims, 4 Drawing Sheets

MULTI-MODE RADIO FREQUENCY (RF) POWER AMPLIFIER CIRCUIT

RELATED APPLICATIONS

This application claims the benefit of U.S. Provisional Patent Application Ser. No. 62/422,328, filed Nov. 15, 2016, which is incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires a higher data rate. As such, sophisticated modulation schemes, such as orthogonal frequency division multiplexing (OFDM), are commonly used in mobile communication devices to help improve spectrum efficiency to achieve the higher data rate. In an OFDM-based wireless system, such as long-term evolution (LTE), radio resources are divided into subcarriers in a frequency domain and symbols in a time domain. The subcarriers are orthogonally separated from each other based on a 15 kilohertz (KHz) frequency spacing. The radio resources are allocated to a mobile device in a unit of resource blocks (RBs). According to one of the radio resource allocation schemes in LTE, an RB includes twelve (12) consecutive subcarriers in the frequency domain and seven (7) consecutive OFDM symbols in the time domain. Accordingly, the RB has a bandwidth of 180 KHz (15 KHz/subcarrier×12 subcarriers).

The mobile device may be allocated multiple RBs for communicating a radio frequency (RF) communications signal. In this regard, a bandwidth of the RF communications signal is proportionally related to a number of RBs allocated to the mobile device. For example, if the mobile device is allocated 25 RBs for communicating the RF communications signal, the RF communications signal would occupy a bandwidth of 4.5 megahertz (MHz) (180 KHz/RB×25 RBs). In contrast, if the mobile device were allocated 300 RBs for communicating the RF communications signal, the RF communications signal would occupy a bandwidth of 54 MHz (180 KHz/RB×300 RBs).

Further, to help achieve the higher data rate in the mobile communication devices, sophisticated power amplifiers (PAs) may be employed to increase output power of RF signals (e.g., maintaining sufficient energy per bit) communicated by the mobile communication devices. Envelope tracking is a power management technology designed to improve efficiency levels of the PAs to help reduce power consumption and thermal dissipation in the mobile communication devices. As the name suggests, envelope tracking employs a system that keeps track of the amplitude envelope of the RF signals communicated by the mobile communication devices. The envelope tracking system constantly adjusts a supply voltage applied to the PAs to ensure that the RF PAs are operating at a higher efficiency for a given instantaneous output power requirement of the RF signals.

SUMMARY

Aspects disclosed in the detailed description include a multi-mode radio frequency (RF) power amplifier circuit. The multi-mode RF power amplifier circuit can operate in a low-resource block (RB) mode and a high-RB mode. In examples discussed herein, the high-RB mode corresponds to more than 300 RBs, and the low-RB mode corresponds to less than or equal to 300 RBs. The multi-mode RF power amplifier circuit includes a driver stage power amplifier and an output stage power amplifier to amplify an RF input signal and generate an RF output signal. A control circuit is configured to provide a constant envelope voltage and an envelope tracking (ET) supply voltage to the driver stage power amplifier and the output stage power amplifier, respectively, in the high-RB mode. As a result, it is possible to optimize RF performance and reduce sensitivity of the driver stage power amplifier and the output stage power amplifier in the high-RB mode, without increasing costs and footprint of the multi-mode RF power amplifier circuit.

In one aspect, a multi-mode RF power amplifier circuit configured to operate in a low-RB mode and a high-RB mode is provided. The multi-mode RF power amplifier circuit includes at least one RF power amplifier circuit. The at least one RF power amplifier circuit includes a driver stage power amplifier configured to receive an RF input signal and amplify the received RF input signal based on a first supply voltage received at a first voltage input to generate a driver stage RF output signal. The at least one RF power amplifier circuit also includes an output stage power amplifier configured to amplify the driver stage RF output signal based on a second supply voltage received at a second voltage input to generate an RF output signal. The multi-mode RF power amplifier circuit also includes a control circuit configured to provide a constant envelope voltage and an ET voltage to the first voltage input and the second voltage input, respectively, in the high-RB mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include a multi-mode radio frequency (RF) power amplifier circuit. The multi-mode RF power amplifier circuit can operate in a low-resource block (RB) mode and a high-RB mode. In examples discussed herein, the high-RB mode corresponds to more than 300 RBs, and the low-RB mode corresponds to less than or equal to 300 RBs. The multi-mode RF power amplifier circuit includes a driver stage power amplifier and an output stage power amplifier to amplify an RF input signal and generate an RF output signal. A control circuit is configured to provide a constant envelope voltage and an envelope tracking (ET) supply voltage to the driver stage power amplifier and the output stage power amplifier, respectively, in the high-RB mode. As a result, it is possible to optimize RF performance and reduce sensitivity of the driver stage power amplifier and the output stage power amplifier in the high-RB mode, without increasing costs and footprint of the multi-mode RF power amplifier circuit.

Figure 1A:
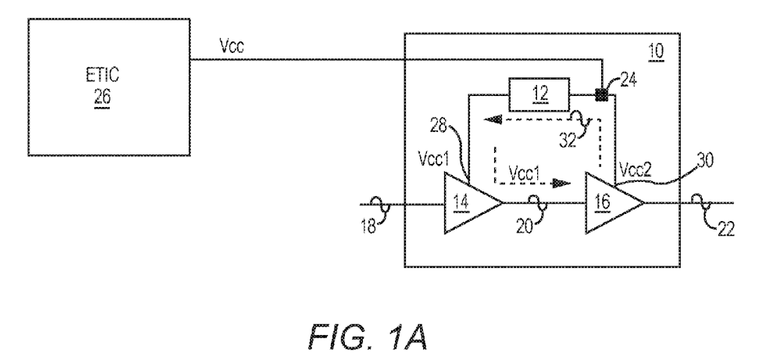
FIG. 1A is a schematic diagram of a conventional radio frequency (RF) power amplifier circuit that requires an isolation circuit for stability reasons.
Figure 1B:
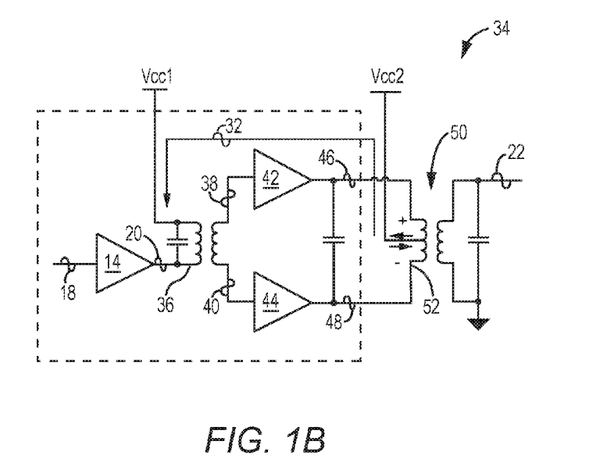
FIG. 1B is a schematic diagram of an exemplary differential RF power amplifier circuit without employing the isolation circuit of FIG. 1A.

Before discussing the multi-mode RF power amplifier circuit of the present disclosure, a brief discussion of some conventional RF power amplifier circuits and potential issues related to the conventional RF power amplifier circuits are first provided with reference to FIGS. 1A-1B. The discussion of specific exemplary aspects of a multi-mode RF power amplifier circuit starts below with reference to FIG. 2.

FIG. 1A is a schematic diagram of a conventional RF power amplifier circuit 10 that requires an isolation circuit 12 for stability reasons. In a non-limiting example, the isolation circuit 12 can be a ferrite circuit. The conventional RF power amplifier circuit 10 includes a driver stage power amplifier 14 and an output stage power amplifier 16 coupled in tandem to the driver stage power amplifier 14. The driver stage power amplifier 14 receives an RF input signal 18 and amplifies the received RF input signal 18 based on a first ET supply voltage $V_{CC1}$ to generate a driver stage RF output signal 20. The output stage power amplifier 16 receives the driver stage RF output signal 20 and amplifies the received driver stage RF output signal 20 based on a second ET supply voltage $V_{CC2}$ to generate an RF output signal 22. The RF input signal 18 can include more than 200 RBs and have a bandwidth in excess of 54 megahertz (MHz) in the high-RB mode.

The conventional RF power amplifier circuit 10 receives an ET voltage $V_{CC}$ at a voltage input 24. The ET voltage $V_{CC}$ is provided from an ET integrated circuit (ETIC) 26. The ET voltage $V_{CC}$ is provided to a first voltage input 28 of the driver stage power amplifier 14 through the isolation circuit 12 as the first ET supply voltage $V_{CC1}$. The ET voltage $V_{CC}$ is also provided to a second voltage input 30 of the output stage power amplifier 16 as the second ET supply voltage $V_{CC2}$.

The output stage power amplifier 16 may generate a reflection signal 32 when amplifying the received driver stage RF output signal 20 based on the second ET supply voltage $V_{CC2}$. The reflection signal 32 may propagate toward the first voltage input 28 of the driver stage power amplifier 14, thus destabilizing the driver stage power amplifier 14. As such, the isolation circuit 12 is configured to block the reflection signal 32 from reaching the driver stage power amplifier 14. In a non-limiting example, the isolation circuit 12 needs to provide an approximately 60 decibel (dB) isolation to prevent the reflection signal 32 from reaching the first voltage input 28.

When the conventional RF power amplifier circuit 10 operates in a high-RB mode, the ETIC 26 generates a high impedance at the voltage input 24. The high impedance of the ETIC 26 may create parallel resonance in certain frequency ranges (e.g., between 120 MHz and 200 MHz), thus reducing the isolation provided by the isolation circuit 12. As a result, the isolation circuit 12 may become more complex and thus more costly. In addition, in the high-RB mode, the first ET supply voltage $V_{CC1}$ may be inadvertently modulated with the driver stage RF output signal 20, thus creating spectrum degradation in the RF output signal 22. Notably, the first ET supply voltage $V_{CC1}$ may not be modulated with the driver stage RF output signal 20 in a low-RB mode.

As an alternative to adding a more complex and costlier isolation circuit in the conventional RF power amplifier circuit 10, it may be possible to replace the conventional RF power amplifier circuit 10 with a differential RF power amplifier circuit. In this regard, FIG. 1B is a schematic diagram of an exemplary differential RF power amplifier circuit 34 without employing the isolation circuit 12 of FIG. 1A. Common elements between FIGS. 1A and 1B are shown therein with common element numbers and will not be re-described herein.

The differential RF power amplifier circuit 34 includes the driver stage power amplifier 14 and a first inductor circuit 36 coupled to the driver stage power amplifier 14. The first inductor circuit 36 receives and converts the driver stage RF output signal 20 into a positive driver stage RF output signal 38 and a negative driver stage RF output signal 40. The differential RF power amplifier circuit 34 includes a first output stage power amplifier 42 and a second output stage power amplifier 44 coupled to the first inductor circuit 36. The first output stage power amplifier 42 receives and amplifies the positive driver stage RF output signal 38 to generate a positive RF output signal 46. The second output stage power amplifier 44 receives and amplifies the negative driver stage RF output signal 40 to generate a negative RF output signal 48. The differential RF power amplifier circuit 34 further includes a second inductor circuit 50 coupled to the first output stage power amplifier 42 and the second output stage power amplifier 44. The second inductor circuit 50 is configured to output the positive RF output signal 46 as the RF output signal 22.

The positive RF output signal 46 and the negative RF output signal 48 may cancel each other at an input end 52 of the second inductor circuit 50, thus reducing the reflection signal 32 by approximately 20 dB. However, this is inadequate to provide the 60 dB isolation required to completely block the reflection signal 32 from reaching the driver stage power amplifier 14.

The conventional RF power amplifier circuit 10 of FIG. 1A and the differential RF power amplifier circuit 34 of FIG. 1B each have obvious shortcomings. The conventional RF power amplifier circuit 10 requires the isolation circuit 12 to provide stability, and the isolation circuit 12 can become more complex and costlier to support high-RB mode operation. The differential RF power amplifier circuit 34 can help eliminate the isolation circuit 12, but is unable to provide the required isolation to completely block the reflection signal 32. Furthermore, in the high-RB mode, the first ET supply voltage $V_{CC1}$ may be inadvertently modulated with the driver stage RF output signal 20, thus creating spectrum degradation in the RF output signal 22. As such, it may be desired to provide an RF power amplifier circuit that overcomes and/or mitigates the above-mentioned shortcomings.

Figure 2:
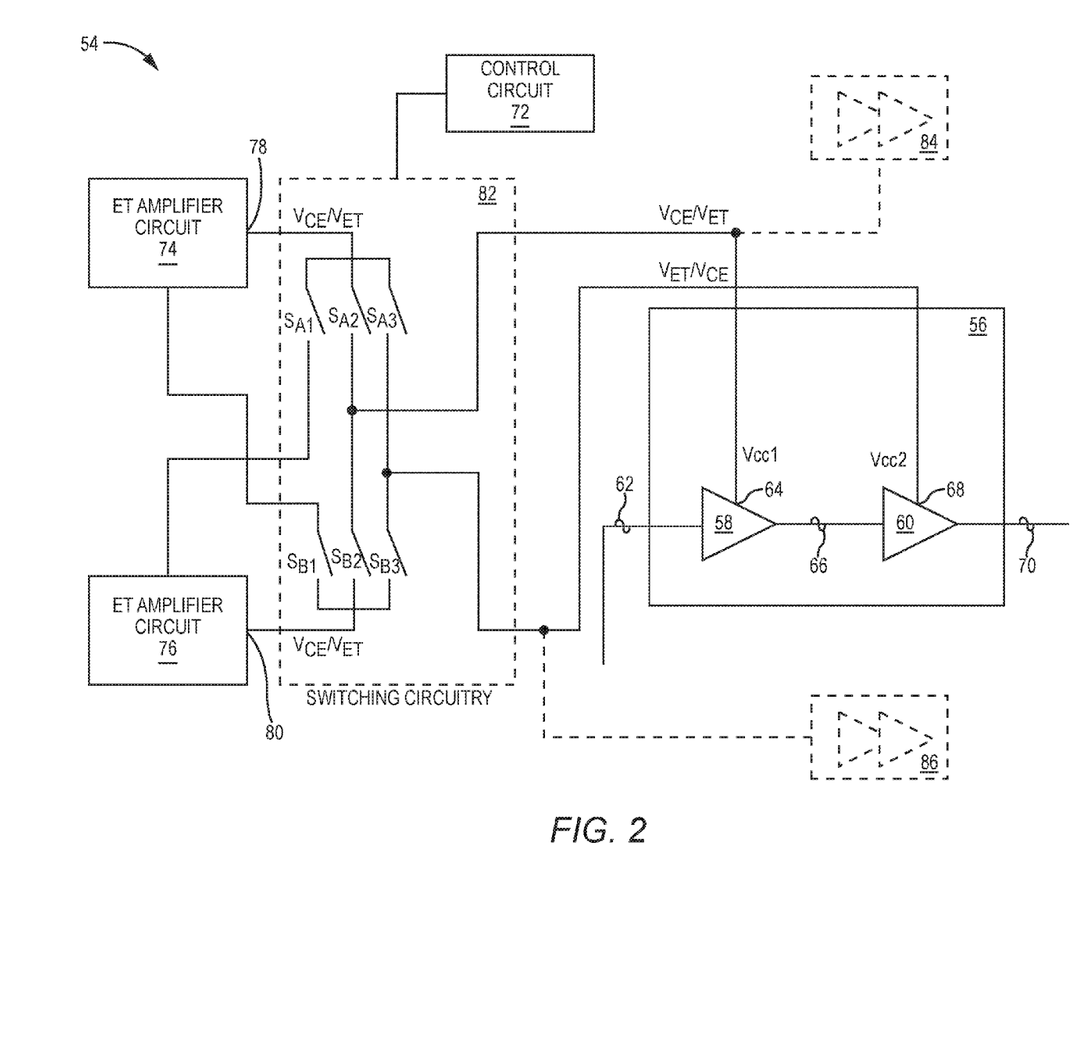
FIG. 2 is a schematic diagram of an exemplary multi-mode RF power amplifier circuit configured to operate in a low-resource block (RB) mode and a high-RB mode without requiring an isolation circuit.

In this regard, FIG. 2 is a schematic diagram of an exemplary multi-mode RF power amplifier circuit 54 configured to operate in a low-RB mode and a high-RB mode without requiring an isolation circuit (e.g., the isolation circuit 12 of FIG. 1A). In the examples discussed herein, the high-RB mode corresponds to more than 300 RBs, and the low-RB mode corresponds to less than or equal to 300 RBs. Notably, the multi-mode RF power amplifier circuit 54 as shown in FIG. 2 only includes elements that are essential for the purpose of illustration and discussion. It shall be appreciated that additional active and/or passive components/circuits may be added to the multi-mode RF power amplifier circuit 54 as well.

The multi-mode RF power amplifier circuit 54 includes at least one RF power amplifier circuit 56. The at least one RF power amplifier circuit 56 includes a driver stage power amplifier 58 and an output stage power amplifier 60 disposed in tandem to the driver stage power amplifier 58. The driver stage power amplifier 58 receives an RF input signal 62, which includes less than or equal to 300 RBs (≤300 RBs) in the low-RB mode and more than 300 RBs (>300 RBs) in the high-RB mode. In a non-limiting example, the RF input signal 62 can be a LTE RF signal. Accordingly, the RF input signal 62 has less than or equal to 54 MHz bandwidth in the low-RB mode and more than 54 MHz bandwidth in the high-RB mode.

The driver stage power amplifier 58 is configured to amplify the RF input signal 62 based on a first supply voltage $V_{CC1}$ received at a first voltage input 64 to generate a driver stage RF output signal 66. The output stage power amplifier 60 is configured to receive the driver stage RF output signal 66. The output stage power amplifier 60 amplifies the driver stage RF output signal 66 based on a second supply voltage $V_{CC2}$ received at a second voltage input 68 to generate an RF output signal 70. The RF output signal 70 may be transmitted from an RF transmission circuit that includes one or more antennas.

The RF input signal 62 may be modulated to carry information based on such modulation schemes as quadrature amplitude modulation (QAM). As such, the RF input signal 62 would have time-varying amplitudes and thus time-varying power levels. Accordingly, when the RF input signal 62 is amplified by the driver stage power amplifier 58 and subsequently the output stage power amplifier 60, the first supply voltage $V_{CC1}$ and the second supply voltage $V_{CC2}$ may be provided either based on an average power level of the RF input signal 62, or by tracking the time-varying power levels of the RF input signal 62. In the examples discussed herein, a supply voltage based on the average power level of the RF input signal 62 is referenced hereinafter as a constant envelope voltage. In contrast, a supply voltage that tracks the time-varying power levels of the RF input signal 62 is referenced hereinafter as an ET voltage.

The multi-mode RF power amplifier circuit 54 includes a control circuit 72, which can be a microprocessor, a microcontroller, a digital signal processor (DSP), or a field-programmable gate array (FPGA), for example. In the high-RB mode, the control circuit 72 is configured to provide a constant envelope voltage $V_{CE}$ to the first voltage input 64 as the first supply voltage $V_{CC1}$ to the driver stage power amplifier 58. In the high-RB mode, the control circuit 72 is further configured to provide an ET voltage $V_{ET}$ to the second voltage input 68 as the second supply voltage $V_{CC2}$ to the output stage power amplifier 60.

Unlike in the conventional RF power amplifier circuit 10 of FIG. 1A, the driver stage power amplifier 58 and the output stage power amplifier 60 are configured to receive the first supply voltage $V_{CC1}$ and the second supply voltage $V_{CC2}$, respectively. As such, the RF power amplifier circuit 56 does not need an isolation circuit, such as the isolation circuit 12 of FIG. 1A, to separate the first voltage input 64 of the driver stage power amplifier 58 from the second voltage input 68 of the output stage power amplifier 60. Therefore, the RF power amplifier circuit 56 can be built with reduced complexity, cost, and footprint compared to the conventional RF power amplifier circuit 10 of FIG. 1A. Further, since the driver stage power amplifier 58 receives the constant envelope voltage $V_{CE}$ as the first supply voltage $V_{CC1}$, as opposed to receiving the ET voltage $V_{ET}$, the first supply voltage $V_{CC1}$ would not be modulated with the driver stage RF output signal 66. As a result, it may be possible to avoid spectrum degradation in the RF output signal 70.

In the low-RB mode, the control circuit 72 may be configured to provide the ET voltage $V_{ET}$ to both the first voltage input 64 and the second voltage input 68. Given that the driver stage power amplifier 58 and the output stage power amplifier 60 receive the ET voltage $V_{ET}$ respectively via the first voltage input 64 and the second voltage input 68, no isolation circuit is required between the first voltage input 64 and the second voltage input 68.

The multi-mode RF power amplifier circuit 54 includes a first ET amplifier circuit 74 and a second ET amplifier circuit 76. The first ET amplifier circuit 74 includes a first voltage output 78 and the second ET amplifier circuit 76 includes a second voltage output 80.

The multi-mode RF power amplifier circuit 54 may include switching circuitry 82. The switching circuitry 82 includes switches $S_{A1}$, $S_{A2}$, $S_{A3}$, $S_{B1}$, $S_{B2}$, and $S_{B3}$. Notably, the switches $S_{A1}$, $S_{A2}$, $S_{A3}$, $S_{B1}$, $S_{B2}$, and $S_{B3}$ are provided herein merely as non-limiting examples. It shall be appreciated that the multi-mode RF power amplifier circuit 54 is not limited to a specific type, quantity, and/or configuration of the switches involved in the switching circuitry 82.

Accordingly, in the high-RB mode, the control circuit 72 can control the switching circuitry 82 to provide the constant envelope voltage $V_{CE}$ and the ET voltage $V_{ET}$ to the first voltage input 64 and the second voltage input 68, respectively. Likewise, in the low-RB mode, the control circuit 72 can control the switching circuitry 82 to provide the ET voltage $V_{ET}$ to the first voltage input 64 and the second voltage input 68.

In one exemplary aspect, the first ET amplifier circuit 74 is configured to output the ET voltage $V_{ET}$ and the constant envelope voltage $V_{CE}$ in the low-RB mode and the high-RB mode, respectively, via the first voltage output 78. The second ET amplifier circuit 76 is configured to output the ET voltage $V_{ET}$ via the second voltage output 80 in both the low-RB mode and the high-RB mode. In this regard, in the high-RB mode, the control circuit 72 may couple the first voltage output 78 of the first ET amplifier circuit 74 to the first voltage input 64 of the driver stage power amplifier 58 to provide the constant envelope voltage $V_{CE}$ to the driver stage power amplifier 58 as the first supply voltage $V_{CC1}$. The control circuit 72 may further couple the second voltage output 80 of the second ET amplifier circuit 76 to the second voltage input 68 of the output stage power amplifier 60 to provide the ET voltage $V_{ET}$ to the output stage power amplifier 60 as the second supply voltage $V_{CC2}$.

Specifically, in the high-RB mode, the control circuit 72 may close the switch $S_{A2}$ to couple the first voltage output 78 of the first ET amplifier circuit 74 to the first voltage input 64 of the driver stage power amplifier 58, thus providing the constant envelope voltage $V_{CE}$ to the first voltage input 64 as the first supply voltage $V_{CC1}$. In addition, the control circuit 72 may close the switch $S_{B3}$ to couple the second voltage output 80 of the second ET amplifier circuit 76 to the second voltage input 68 of the output stage power amplifier 60, thus providing the ET voltage $V_{ET}$ to the second voltage input 68 as the second supply voltage $V_{CC2}$. In addition, the control circuit 72 may close the switch $S_{A1}$ to couple the first voltage output 78 to the second ET amplifier circuit 76 to provide the constant envelope voltage $V_{CE}$ as a respective supply voltage to the second ET amplifier circuit 76. Accordingly, the second ET amplifier circuit 76 is powered by the constant envelope voltage $V_{CE}$ to generate the ET voltage $V_{ET}$ at the second voltage output 80.

In the low-RB mode, the control circuit 72 controls the switching circuitry 82 based on whether the first ET amplifier circuit 74 and the second ET amplifier circuit 76 are configured to support a single-transmission (single-TX) operation (e.g., an uplink carrier aggregation (ULCA) operation) or a dual-transmission (dual-TX) operation (e.g., a multiple-input multiple-output (MIMO) operation). In the single-TX operation, the first ET amplifier circuit 74 is configured not to output the ET voltage $V_{ET}$ at the first voltage output 78. As such, the control circuit 72 may close the switches $S_{B2}$ and $S_{B3}$ to couple the second voltage output 80 to the first voltage input 64 and the second voltage input 68 to provide the ET voltage $V_{ET}$ to the driver stage power amplifier 58 and the output stage power amplifier 60, respectively.

In contrast, in the dual-TX operation, the first ET amplifier circuit 74 and the second ET amplifier circuit 76 are configured to output the ET voltage $V_{ET}$ at the first voltage output 78 and the second voltage output 80, respectively. Accordingly, the control circuit 72 may close the switch $S_{A2}$ to couple the first voltage output 78 to the first voltage input 64 to provide the ET voltage $V_{ET}$ to the driver stage power amplifier 58. Likewise, the control circuit 72 may close the switch $S_{B3}$ to couple the second voltage output 80 to the second voltage input 68 to provide the ET voltage $V_{ET}$ to the output stage power amplifier 60. In addition, the control circuit 72 may further couple the first voltage output 78 to at least one first additional RF power amplifier circuit 84 to enable the dual-TX operation.

In another exemplary aspect, the second ET amplifier circuit 76 is configured to output the ET voltage $V_{ET}$ and the constant envelope voltage $V_{CE}$ in the low-RB mode and the high-RB mode, respectively, via the second voltage output 80. The first ET amplifier circuit 74 is configured to output the ET voltage $V_{ET}$ via the first voltage output 78 in both the low-RB mode and the high-RB mode. In this regard, in the high-RB mode, the control circuit 72 may couple the second voltage output 80 of the second ET amplifier circuit 76 to the first voltage input 64 of the driver stage power amplifier 58 to provide the constant envelope voltage $V_{CE}$ to the driver stage power amplifier 58 as the first supply voltage $V_{CC1}$. The control circuit 72 may further couple the first voltage output 78 of the first ET amplifier circuit 74 to the second voltage input 68 of the output stage power amplifier 60 to provide the ET voltage $V_{ET}$ to the output stage power amplifier 60 as the second supply voltage $V_{CC2}$.

Specifically, in the high-RB mode, the control circuit 72 may close the switch $S_{B2}$ to couple the second voltage output 80 of the second ET amplifier circuit 76 to the first voltage input 64 of the driver stage power amplifier 58, thus providing the constant envelope voltage $V_{CE}$ to the first voltage input 64 as the first supply voltage $V_{CC1}$. In addition, the control circuit 72 may close the switch $S_{A3}$ to couple the first voltage output 78 of the first ET amplifier circuit 74 to the second voltage input 68 of the output stage power amplifier 60, thus providing the ET voltage $V_{ET}$ to the second voltage input 68 as the second supply voltage $V_{CC2}$. In addition, the control circuit 72 may close the switch $S_{B1}$ to couple the second voltage output 80 to the first ET amplifier circuit 74 to provide the constant envelope voltage $V_{CE}$ as a respective supply voltage to the first ET amplifier circuit 74. Accordingly, the first ET amplifier circuit 74 is powered by the constant envelope voltage $V_{CE}$ to generate the ET voltage $V_{ET}$ at the first voltage output 78.

In the low-RB mode, the control circuit 72 controls the switching circuitry 82 based on whether the first ET amplifier circuit 74 and the second ET amplifier circuit 76 are configured to support the single-TX operation (e.g., the ULCA operation) or the dual-transmission (dual-TX) operation (e.g., the MIMO operation). In the single-TX operation, the second ET amplifier circuit 76 is configured not to output the ET voltage $V_{ET}$ at the second voltage output 80. As such, the control circuit 72 may close the switches $S_{A2}$ and $S_{A3}$ to couple the first voltage output 78 to the first voltage input 64 and the second voltage input 68 to provide the ET voltage $V_{ET}$ to the driver stage power amplifier 58 and the output stage power amplifier 60, respectively.

In contrast, in the dual-TX operation, the first ET amplifier circuit 74 and the second ET amplifier circuit 76 are configured to output the ET voltage $V_{ET}$ at the first voltage output 78 and the second voltage output 80, respectively. Accordingly, the control circuit 72 may close the switch $S_{B2}$ to couple the second voltage output 80 to the first voltage input 64 to provide the ET voltage $V_{ET}$ to the driver stage power amplifier 58. Likewise, the control circuit 72 may close the switch $S_{A3}$ to couple the first voltage output 78 to the second voltage input 68 to provide the ET voltage $V_{ET}$ to the output stage power amplifier 60. In addition, the control circuit 72 may further couple the second voltage output 80 to at least one second additional RF power amplifier circuit 86 to enable the dual-TX operation.

Figure 3:
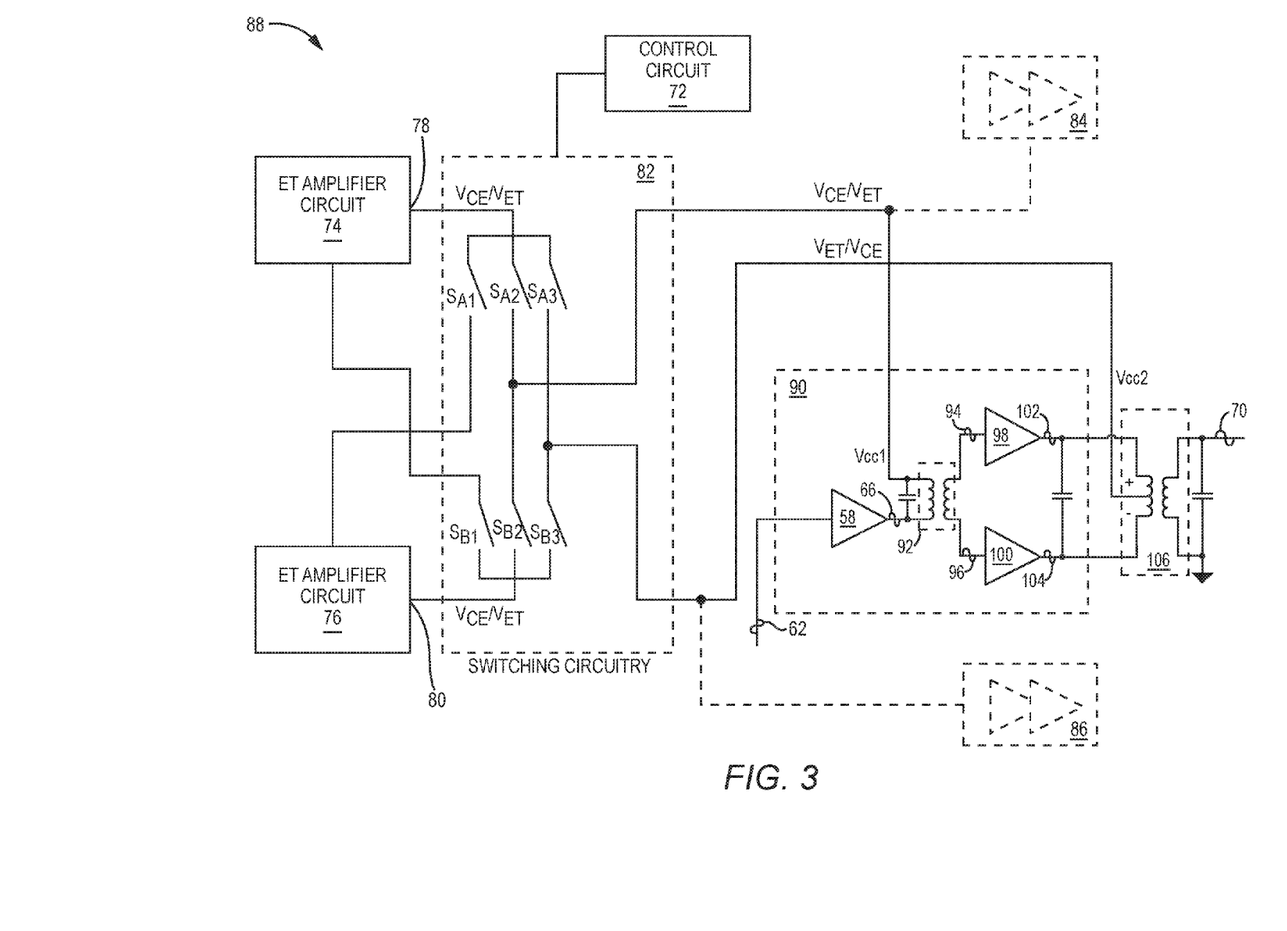
FIG. 3 is a schematic diagram of an exemplary multi-mode RF power amplifier including a differential RF power amplifier circuit and configured to operate in the low-RB mode and the high-RB mode of FIG. 2.

The RF power amplifier circuit 56 may be replaced by a differential RF power amplifier circuit. In this regard, FIG. 3 is a schematic diagram of an exemplary multi-mode RF power amplifier 88 including a differential RF power amplifier circuit 90 and configured to operate in the low-RB mode and the high-RB mode of FIG. 2. Common elements between FIGS. 2 and 3 are shown therein with common element numbers and will not be re-described herein.

The differential RF power amplifier circuit 90 includes a first inductor circuit 92 coupled to the driver stage power amplifier 58. The first inductor circuit 92 is configured to receive and convert the driver stage RF output signal 66 into a positive driver stage RF output signal 94 and a negative driver stage RF output signal 96. The differential RF power amplifier circuit 90 includes a first output stage power amplifier 98 and a second output stage power amplifier 100. The first output stage power amplifier 98 is configured to receive and amplify the positive driver stage RF output signal 94 to generate a positive RF output signal 102. The second output stage power amplifier 100 is configured to receive and amplify the negative driver stage RF output signal 96 to generate a negative RF output signal 104. The differential RF power amplifier circuit 90 includes a second inductor circuit 106 coupled to the first output stage power amplifier 98 and the second output stage power amplifier 100. The second inductor circuit 106 is configured to output the positive RF output signal 102 as the RF output signal 70.

In one non-limiting example, in the high-RB mode, the first ET amplifier circuit 74 is configured to output the constant envelope voltage $V_{CE}$ at the first voltage output 78 and the second ET amplifier circuit 76 is configured to output the ET voltage $V_{ET}$ at the second voltage output 80. Accordingly, the control circuit 72 closes the switch $S_{A2}$ to couple the first voltage output 78 to the first inductor circuit 92. The control circuit 72 also closes the switch $S_{B3}$ to couple the second voltage output 80 to the second inductor circuit 106.

In another non-limiting example, in the high-RB mode, the second ET amplifier circuit 76 is configured to output the constant envelope voltage $V_{CE}$ at the second voltage output 80 and the first ET amplifier circuit 74 is configured to output the ET voltage $V_{ET}$ at the first voltage output 78. Accordingly, the control circuit 72 closes the switch $S_{B2}$ to couple the second voltage output 80 to the first inductor circuit 92. The control circuit 72 also closes the switch $S_{A3}$ to couple the first voltage output 78 to the second inductor circuit 106.

Figure 4:
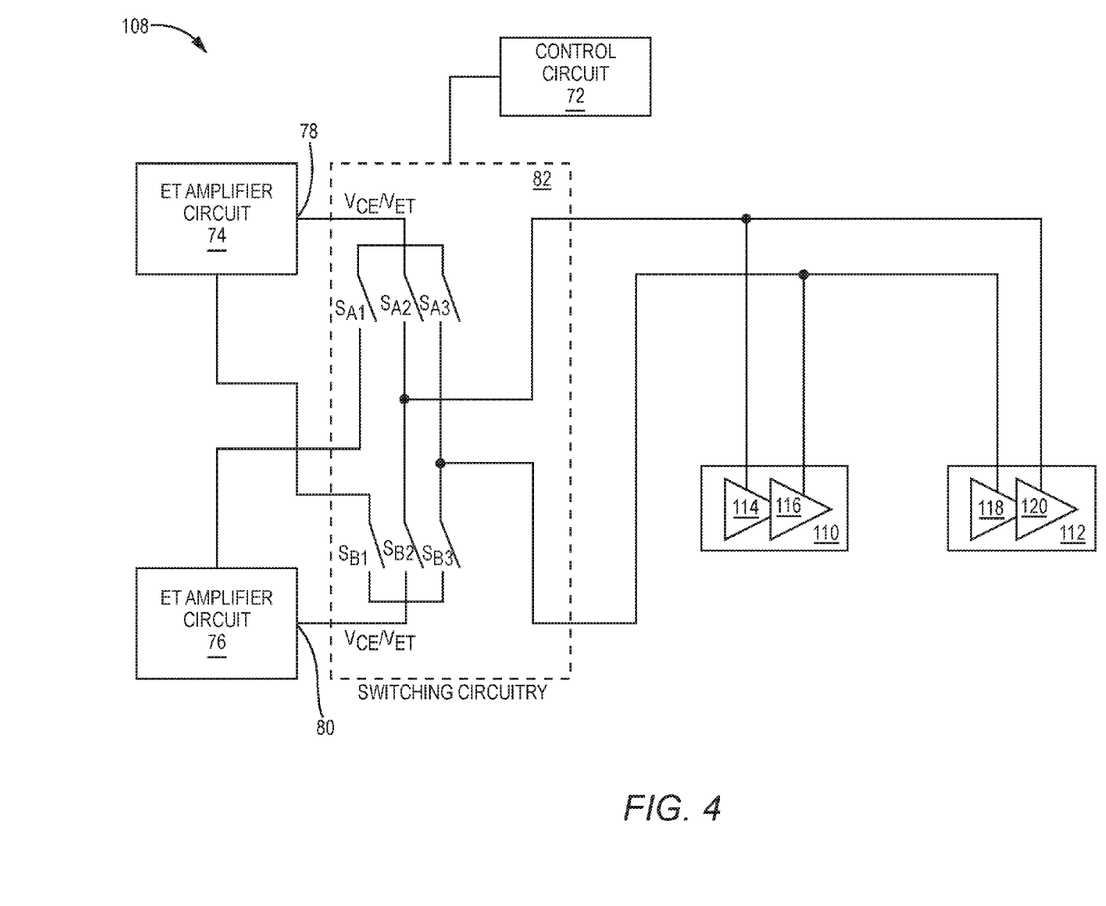
FIG. 4 is a schematic diagram of an exemplary multi-mode RF power amplifier circuit configured to support multiple RF power amplifier circuits in the high-RB mode and the low-RB mode of FIG. 2.

The multi-mode RF power amplifier circuit 54 of FIG. 2 can be adapted to support multiple RF power amplifier circuits connected in tandem. In this regard, FIG. 4 is a schematic diagram of an exemplary multi-mode RF power amplifier circuit 108 configured to support multiple RF power amplifier circuits in the high-RB mode and the low-RB mode of FIG. 2. Common elements between FIGS. 2 and 4 are shown therein with common element numbers and will not be re-described herein.

The multi-mode RF power amplifier circuit 108 includes at least one first RF power amplifier circuit 110 and at least one second RF power amplifier circuit 112 connected in tandem to the first RF power amplifier circuit 110. The first RF power amplifier circuit 110 includes a first driver stage power amplifier 114 and a first output stage power amplifier 116. The second RF power amplifier circuit 112 includes a second driver stage power amplifier 118 and a second output stage power amplifier 120.

In the high-RB mode, the control circuit 72 provides the constant envelope voltage $V_{CE}$ to the first driver stage power amplifier 114 and the second output stage power amplifier 120. The control circuit 72 is further configured to provide the ET voltage $V_{ET}$ to the first output stage power amplifier 116 and the second driver stage power amplifier 118.

In one non-limiting example, in the high-RB mode, the first ET amplifier circuit 74 is configured to output the constant envelope voltage $V_{CE}$ at the first voltage output 78 and the second ET amplifier circuit 76 is configured to output the ET voltage $V_{ET}$ at the second voltage output 80. Accordingly, the control circuit 72 closes the switch $S_{A2}$ to couple the first voltage output 78 to the first driver stage power amplifier 114 and the second output stage power amplifier 120. The control circuit 72 also closes the switch $S_{B3}$ to couple the second voltage output 80 to the first output stage power amplifier 116 and the second driver stage power amplifier 118.

In another non-limiting example, in the high-RB mode, the second ET amplifier circuit 76 is configured to output the constant envelope voltage $V_{CE}$ at the second voltage output 80 and the first ET amplifier circuit 74 is configured to output the ET voltage $V_{ET}$ at the first voltage output 78. Accordingly, the control circuit 72 closes the switch $S_{B2}$ to couple the second voltage output 80 to the first driver stage power amplifier 114 and the second output stage power amplifier 120. The control circuit 72 also closes the switch $S_{A3}$ to couple the first voltage output 78 to the first output stage power amplifier 116 and the second driver stage power amplifier 118.

Notably, the multi-mode RF power amplifier circuit 108 enables ET operation of ULCA inter-band and ULCA contiguous band with very wide modulation bandwidth associated with the high-RB mode (e.g., 400 RBs). Moreover, the multi-mode RF power amplifier circuit 108 may be able to achieve improved performance without the need to modulate both driver and output stages at the same time.

Those skilled in the art will recognize improvements and modifications to the embodiments of the present disclosure. All such improvements and modifications are considered within the scope of the concepts disclosed herein and the claims that follow.

What is claimed is:

1. A multi-mode radio frequency (RF) power amplifier circuit configured to operate in a low-resource block (RB) mode and a high-RB mode, comprising:
   at least one RF power amplifier circuit, comprising:
      a driver stage power amplifier configured to receive an RF input signal and amplify the received RF input signal based on a first supply voltage received at a first voltage input to generate a driver stage RF output signal; and
      an output stage power amplifier configured to amplify the driver stage RF output signal based on a second supply voltage received at a second voltage input to generate an RF output signal; and
   a control circuit configured to provide a constant envelope voltage and an envelope tracking (ET) voltage to the first voltage input and the second voltage input, respectively, in the high-RB mode.

2. The multi-mode RF power amplifier circuit of claim 1, wherein the control circuit is further configured to provide the ET voltage to the first voltage input and the second voltage input in the low-RB mode.

3. The multi-mode RF power amplifier circuit of claim 2, further comprising:
   a first ET amplifier circuit comprising a first voltage output configured to output the ET voltage in the low-RB mode and output the constant envelope voltage in the high-RB mode; and
   a second ET amplifier circuit comprising a second voltage output configured to output the ET voltage in the low-RB mode and the high-RB mode.

4. The multi-mode RF power amplifier circuit of claim 3, wherein in the high-RB mode the control circuit is further configured to:
   couple the first voltage output of the first ET amplifier circuit to the first voltage input of the driver stage power amplifier to provide the constant envelope voltage to the driver stage power amplifier; and
   couple the second voltage output of the second ET amplifier circuit to the second voltage input of the output stage power amplifier to provide the ET voltage to the output stage power amplifier.

5. The multi-mode RF power amplifier circuit of claim 4, wherein in the high-RB mode the control circuit is further configured to couple the first voltage output of the first ET amplifier circuit to the second ET amplifier circuit to provide the constant envelope voltage as a respective supply voltage to the second ET amplifier circuit.

6. The multi-mode RF power amplifier circuit of claim 3, wherein in the low-RB mode the control circuit is further configured to:
couple the second voltage output of the second ET amplifier circuit to the first voltage input of the driver stage power amplifier to provide the ET voltage to the driver stage power amplifier; and
couple the second voltage output of the second ET amplifier circuit to the second voltage input of the output stage power amplifier to provide the ET voltage to the output stage power amplifier.

7. The multi-mode RF power amplifier circuit of claim 3, wherein in the low-RB mode the control circuit is further configured to:
couple the first voltage output of the first ET amplifier circuit to the first voltage input of the driver stage power amplifier to provide the ET voltage to the driver stage power amplifier; and
couple the second voltage output of the second ET amplifier circuit to the second voltage input of the output stage power amplifier to provide the ET voltage to the output stage power amplifier.

8. The multi-mode RF power amplifier circuit of claim 7, wherein the control circuit is further configured to couple the first voltage output of the first ET amplifier circuit to at least one first additional RF power amplifier circuit.

9. The multi-mode RF power amplifier circuit of claim 2, further comprising:
a first ET amplifier circuit comprising a first voltage output configured to output the ET voltage in the low-RB mode and the high-RB mode; and
a second ET amplifier circuit comprising a second voltage output configured to output the ET voltage in the low-RB mode and output the constant envelope voltage in the high-RB mode.

10. The multi-mode RF power amplifier circuit of claim 9, wherein in the high-RB mode the control circuit is further configured to:
couple the second voltage output of the second ET amplifier circuit to the first voltage input of the driver stage power amplifier to provide the constant envelope voltage to the driver stage power amplifier; and
couple the first voltage output of the first ET amplifier circuit to the second voltage input of the output stage power amplifier to provide the ET voltage to the output stage power amplifier.

11. The multi-mode RF power amplifier circuit of claim 10, wherein in the high-RB mode the control circuit is further configured to couple the second voltage output of the second ET amplifier circuit to the first ET amplifier circuit to provide the constant envelope voltage as a respective supply voltage to the first ET amplifier circuit.

12. The multi-mode RF power amplifier circuit of claim 9, wherein in the low-RB mode the control circuit is further configured to:
couple the first voltage output of the first ET amplifier circuit to the first voltage input of the driver stage power amplifier to provide the ET voltage to the driver stage power amplifier; and
couple the first voltage output of the first ET amplifier circuit to the second voltage input of the output stage power amplifier to provide the ET voltage to the output stage power amplifier.

13. The multi-mode RF power amplifier circuit of claim 9, wherein in the low-RB mode the control circuit is further configured to:
couple the second voltage output of the second ET amplifier circuit to the first voltage input of the driver stage power amplifier to provide the ET voltage to the driver stage power amplifier; and
couple the first voltage output of the first ET amplifier circuit to the second voltage input of the output stage power amplifier to provide the ET voltage to the output stage power amplifier.

14. The multi-mode RF power amplifier circuit of claim 13, wherein the control circuit is further configured to couple the second voltage output of the second ET amplifier circuit to at least one second additional RF power amplifier circuit.

15. The multi-mode RF power amplifier circuit of claim 2, further comprising switching circuitry, wherein the control circuit is further configured to:
control the switching circuitry to provide the ET voltage to the first voltage input and the second voltage input in the low-RB mode; and
control the switching circuitry to provide the constant envelope voltage and the ET voltage to the first voltage input and the second voltage input, respectively, in the high-RB mode.

16. The multi-mode RF power amplifier circuit of claim 2, wherein the at least one RF power amplifier circuit further comprises a first inductor circuit coupled to the driver stage power amplifier, the first inductor circuit configured to receive and convert the driver stage RF output signal into a positive driver stage RF output signal and a negative driver stage RF output signal.

17. The multi-mode RF power amplifier circuit of claim 16, wherein the output stage power amplifier comprises:
a first output stage power amplifier configured to receive the positive driver stage RF output signal and amplify the positive driver stage RF output signal to generate a positive RF output signal; and
a second output stage power amplifier configured to receive the negative driver stage RF output signal and amplify the negative driver stage RF output signal to generate a negative RF output signal.

18. The multi-mode RF power amplifier circuit of claim 17, wherein the at least one RF power amplifier circuit further comprises a second inductor circuit coupled to the first output stage power amplifier and the second output stage power amplifier, the second inductor circuit configured to output the positive RF output signal as the RF output signal.

19. The multi-mode RF power amplifier circuit of claim 2, wherein:
the at least one RF power amplifier circuit comprises at least one first RF power amplifier circuit and at least one second RF power amplifier circuit connected in tandem to the at least one first RF power amplifier circuit, wherein:
the at least one first RF power amplifier circuit comprises a first driver stage power amplifier and a first output stage power amplifier; and
the at least one second RF power amplifier circuit comprises a second driver stage power amplifier and a second output stage power amplifier; and
in the high-RB mode, the control circuit is configured to:
provide the constant envelope voltage to the first driver stage power amplifier and the second output stage power amplifier; and provide the ET voltage to the first output stage power amplifier and the second driver stage power amplifier.

20. The multi-mode RF power amplifier circuit of claim 1, wherein the at least one RF power amplifier circuit does not include an isolation circuit configured to separate the first voltage input from the second voltage input.

* * * * *